United States Patent [19]

Miyake

[11] Patent Number: 5,219,771
[45] Date of Patent: Jun. 15, 1993

[54] METHOD OF PRODUCING A THIN FILM TRANSISTOR DEVICE

[75] Inventor: Hiroyuki Miyake, Kanagawa, Japan

[73] Assignee: Fuji Xerox Co., Ltd., Tokyo, Japan

[21] Appl. No.: 762,631

[22] Filed: Sep. 18, 1991

Related U.S. Application Data

[63] Continuation of Ser. No. 384,797, Jul. 25, 1989, abandoned.

[30] Foreign Application Priority Data

Jul. 30, 1988 [JP] Japan ............... 63-190837

[51] Int. Cl.⁵ ............... H01L 21/336; H01L 29/76; G02L 1/13; G02L 1/133
[52] U.S. Cl. ............... 437/40; 437/48; 257/356; 359/59; 359/87
[58] Field of Search ............... 437/40, 41, 48, 101, 437/233, 245; 357/23.12, 23.7, 2, 4, 17; 359/59, 87

[56] References Cited

U.S. PATENT DOCUMENTS

| | | | |
|---|---|---|---|
| 4,803,536 | 2/1989 | Tuan | 357/23.12 |
| 4,876,584 | 10/1989 | Taylor | 357/23.13 |
| 5,068,748 | 11/1991 | Ukai et al. | 357/23.13 |

FOREIGN PATENT DOCUMENTS

| | | |
|---|---|---|
| 0092929 | 4/1988 | Japan . |
| 0180935 | 7/1988 | Japan . |
| 0208023 | 8/1988 | Japan . |
| 0032234 | 2/1989 | Japan . |
| 0302228 | 12/1989 | Japan . |

*Primary Examiner*—Mary Wilczewski
*Attorney, Agent, or Firm*—Finnegan, Henderson, Farabow, Garrett & Dunner

[57] ABSTRACT

A method of producing on a substrate at least one transistor having electrodes with low interelectrode capacitance, the method characterized by the steps of forming at least one transistor on a substrate, forming a guard conductor on the substrate, forming electrical connectors on the substrate to electrically connect the electrodes and guard conductor while the electrodes have substantially equal electrical potential, and severing the electrical connections to separate the guard conductor from the electrodes.

5 Claims, 3 Drawing Sheets

METHOD OF PRODUCING A THIN FILM TRANSISTOR DEVICE

This application is a continuation of application Ser. No. 07/384,797 filed Jul. 25, 1989, now abandoned.

BACKGROUND OF THE INVENTION

1. Field of the Invention

The present invention relates to a method of producing a thin film transistor device and, more specifically, to a method of producing a plurality of thin film transistors on a substrate of glass or the like.

2. Description of the Relates Art

In producing a large area device that includes a number of thin film transistors, there has been performed a process in which a number of thin film transistors are formed on a substrate of glass or the like, and then the substrate is cut off at predetermined sizes into final products.

FIG. 5 shows a conventional method of producing a thin film transistor device. In FIG. 5, a substrate 1 of glass or the like, has formed thereon a thin film transistor 2, a pad 3, a substrate cutting line 4, a wiring pattern 8, a gate G, a source S, and a drain D.

On the substrate 1, the thin film transistors 2 are formed by stacking layers and, at the same time, the wiring patterns 8, and the pads 3 are formed so as to be connected with the electrodes of the respective thin film transistors 2. Thereafter, the substrate 1 is cut along the substrate cutting line 4 so as to obtain a thin film transistor device.

In such a conventional method of producing a thin film transistor device as mentioned above, however, there has been a problem in that the insulation between the gate and drain or between the gate and source may be broken by discharge due to static electricity produced during the manufacturing process.

FIG. 6 is a sectional view of stacked layers of a conventional thin film transistor. In FIG. 6 a thin film transistor 2, includes a wiring pattern 8, a gate 9, an insulating layer 10, a semiconductor active layer 11, an ohmic contact layer 12, a source 13, a drain 14, and a conductor layer 15. The gate 9 is elongated in the direction perpendicular to the paper and is connected to the gates of other thin film transistors (with reference to G in FIG. 5).

The respective electrodes of the source, drain, and gate are formed of electric conductors, and the insulating layer 10 is interposed between the electrodes. Accordingly, there exists electrostatic capacity between the gate and source or between the gate and drain.

FIG. 7 is a diagram showing the existence of electrostatic capacity between electrodes of a thin film transistor. An electrostatic capacity $C_1$ exists between the gate G and source S, and an electrostatic capacity $C_2$ exists between the gate G and drain D.

During the production process, undesirable static electricity sometimes forms while the substrate 1, having thin film transistors 2 formed thereon, is being conveyed through conveyor lines.

The formation of static electricity may take place, for example, when the substrate 1 moves from one conveyor line to another. If there is a difference in speed between the conveyor lines, one of the conveyor lines may slip on the substrate 1 causing the substrate 1 to be rubbed by the slipping conveyor line. This rubbing between the substrate 1 and the slipping conveyor line causes friction between the two and results in the formation of static electricity.

The marks "+" in FIG. 6 represent static electricity. Although there is no significant problem in the case where the static electricity is distributed uniformly, there is a problem if the static electricity is locally concentrated. However, static electricity is apt to be concentrated locally (because a substrate has various layers formed thereon in various shapes). As a result of such local static charge concentration, the potential difference between the gate and drain becomes large and the insulation between the gate and drain becomes large and the insulation between the gate and drain is subjected to discharge-breakdown. The same applies to the insulation between the gate and source. If such discharge-breakdown occurs, the thin film transistor can no longer perform its function.

SUMMARY OF THE INVENTION

Accordingly, it is an object of the present invention to provide a solution to the foregoing problems associated with the related art.

Another object of the present invention is to provide a method of producing thin film transistor devices that are not damaged by the discharge of static electricity between the gate and source during fabrication.

These and other objects are attained by a method of producing on a substrate at least one transistor having electrodes with low interelectrode capacitance, the method characterized by the steps of forming at least one transistor on the substrate, forming a guard conductor on the substrate, forming electrical connections on the substrate to electricity connect the electrodes and the guard conductor while the electrodes have substantially equal electrical potential, and severing the electrical connections to separate the guard conductor from the electrodes.

BRIEF DESCRIPTION OF THE DRAWINGS

The manner by which the above objects and other objects, features, and advantages of the present invention are attained will be fully apparent form the following detailed description when it is considered in view of the drawings, wherein.

DETAILED DESCRIPTION OF THE PREFERRED EMBODIMENTS

Figure 1:
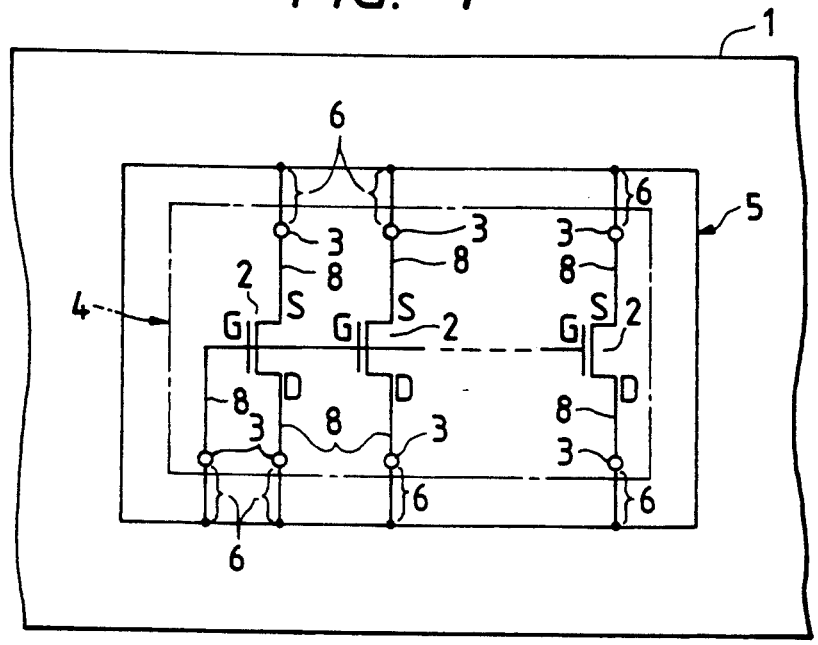
FIG. 1 is a diagram illustrating a first embodiment of the present invention.

Reference will now be made in detail to the method of the present invention as illustrated in the accompanying drawings, in which like reference characters designate like or corresponding parts throughout the several drawings.

In the method of producing a thin film transistor device according to the present invention, thin film transistors, a guard conductor, and connection lines for connection of the thin film transistors with the guard conductor are formed on a substrate, the guard conductor being formed in a step before formation of interelectrode capacitance of the thin film transistors, and the connection lines are cut off together with the substrate so as to separate the guard conductor from the thin film transistors.

Therefore, the insulation between the short-circuited electrodes will not be subjected to discharge-breakdown even if static electricity is provided in the process of production.

Moreover, being provided so as to envelop the thin film transistors, the guard conductor acts to prevent static electricity produced in its surroundings from intruding inside of the guard conductor. Therefore, even if output electrodes exist which are not short-circuited by the guard conductor because of having pads used without connection with other ones, the potential difference between the output electrodes and the other electrodes will not be sufficient to discharge-breakdown the insulation between the electrodes.

Figure 5:
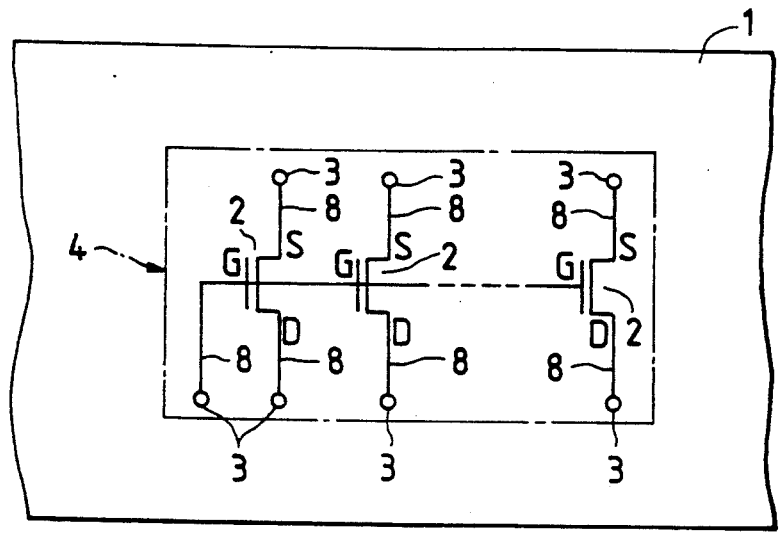
FIG. 5 is a diagram illustrating a conventional method of producing a thin film transistor device.

FIG. 1 shows the first embodiment of the present invention. Parts the same as those in FIG. 5 are referenced by the same reference numerals. The reference numeral 5 represents a guard conductor, and 6 represents a connection line.

The guard conductor 5 is a conductor layer surrounding the substrate cutting line 4, and the connection lines 6 are conductor layers for connecting the pads 3 with the guard conductor 5. Thus, all the pads 3 are short-circuited so that they are equal in potential.

Figure 4:
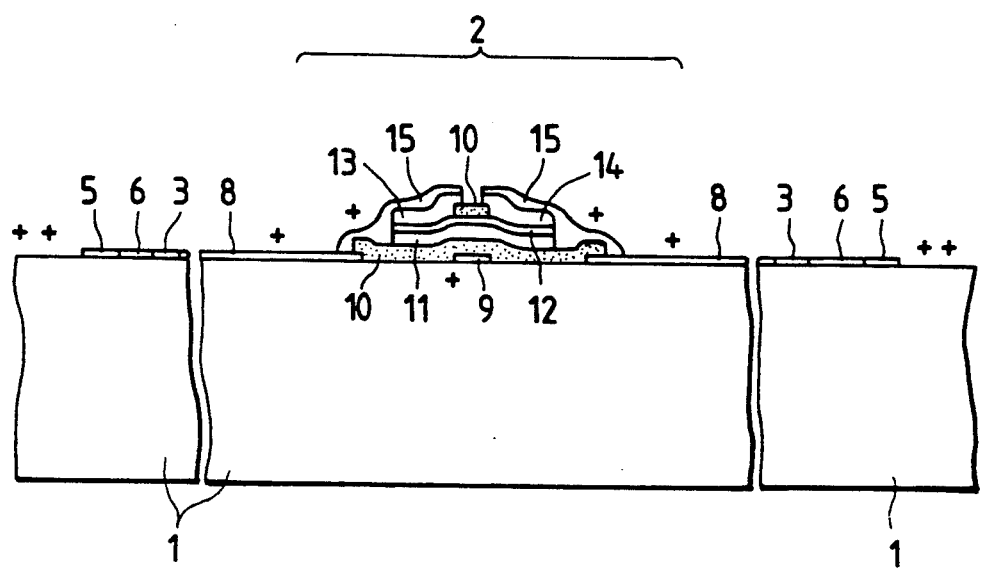
FIG. 4 is a sectional view of stacked layers of a thin film transistor according to the present invention.
Figure 6:
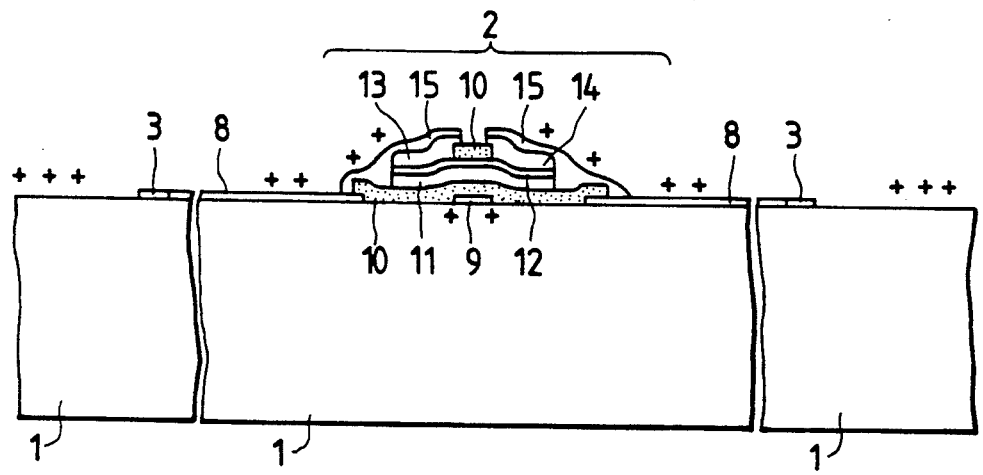
FIG. 6 is a sectional view of stacked layers of a conventional thin film transistor.
Figure 7:
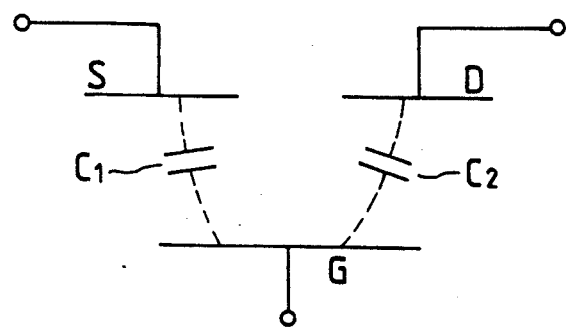
FIG. 7 is a diagram illustrating the state of existence of electrostatic capacity between electrodes of a thin film transistor.

FIG. 4 is a sectional view of stacked layers of a thin film transistor according to the present invention. The reference numerals in the drawings correspond to those in FIG. 6. The difference from FIG. 6 is that a guard conductor 5 and connection lines 6 are additionally provided.

The guard conductor 5 and the connection lines 6 are formed at the same time as a layer is formed on a substrate in the first place. Therefore, at the time the electrodes (gates, source and drain), the wiring patterns 8 between the electrodes, and the pads 3 are formed, all the electrodes are made equal in potential. Consequently, even if static electricity is produced during the production process, the static electricity will not be concentrated in any one of the electrodes (for example, drain) of the thin film transistor 2 with the consequence that the potential difference from another electrode (for example, gate) becomes large. Therefore, discharge-breakdown of the insulation between the electrodes of the thin film transistor 2 is prevented from occurring.

In the last step of the process of production, the substrate is cut along the substrate cutting line 4 so that part of the connection lines 6 and the guard conductor 5 are separated off.

Figure 3:
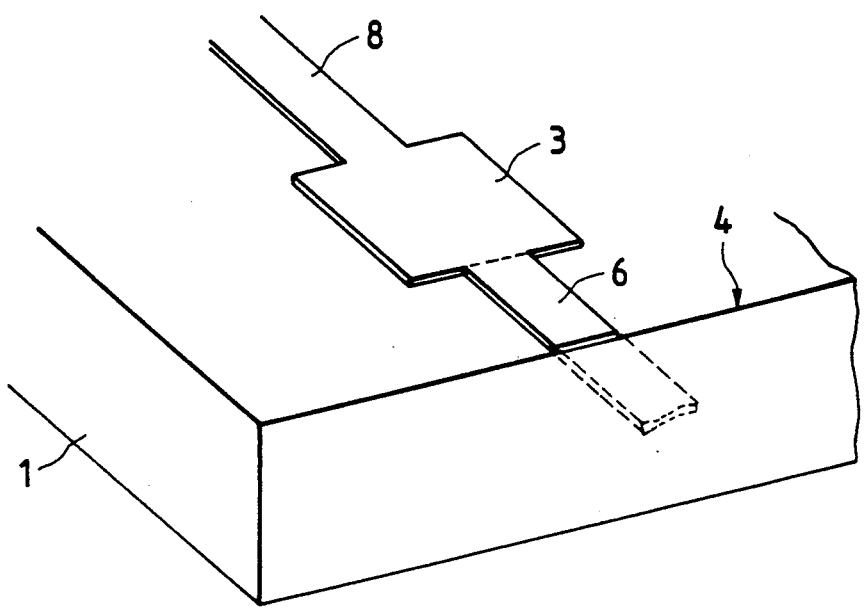
FIG. 3 is an enlarged diagram of the surroundings of a pad of a thin film transistor.

FIG. 3 is an enlarged diagram of the surroundings of a pad of a thin film transistor. The connection line 6 is cut off in the way along the substrate cutting line 4, so that a part thereof is left connected with the pad 3. However, since the pad 3 is connected with another circuit element through a bonding wire, there is no trouble on the circuit operation even if a part of the connection line 6 is left.

Depending on the purpose of use of a thin film transistor, there is a case where it is impossible to cause the thin film transistor to achieve a predetermined operation if a part of a connection line 6 is left connected with the pad 3.

For example, in a printer or the like, since electric charges floating in the air are generated by a corotron (charger), it is necessary to control the flow of such electric charges. In that case, the control of the flow of the electric charges is sometimes performed by controlling the potential of a pad with an output electrode (for example, a source) of a thin film transistor. That is, if the potential of the pad is changed, the electric field above the pad varies to make it possible to perform the control on the flow of the electric charges floating in the air.

In the case of a thin film transistor to be used for such a purpose, the area and shape of a pad connected with an output electrode influence greatly the control of electric charges floating in the air above the pad. In order to perform desired control, the pad must have a predetermined shape and area.

If such a pad is also connected with a guard conductor through a connection line, a part of the connection line 6 left at the time of cutting along a substrate cutting line (with reference to FIG. 3) acts, in the same manner as the pad, on the above-mentioned control. This means that the shape and area of the pad is substantially changed.

On the other hand, the shape and area of a part of the connection line 6 left at the time of cutting along a substrate cutting line may vary depending on the way of cutting a substrate, that is, depending on the position of the substrate cutting line, so that the shape and area of the left part of the connection line 6 may vary. Therefore, control of the flow of electric charges cannot be performed accurately. Thin film transistors to be used for such a purpose are produced in a manner as shown in FIG. 2.

Figure 2:
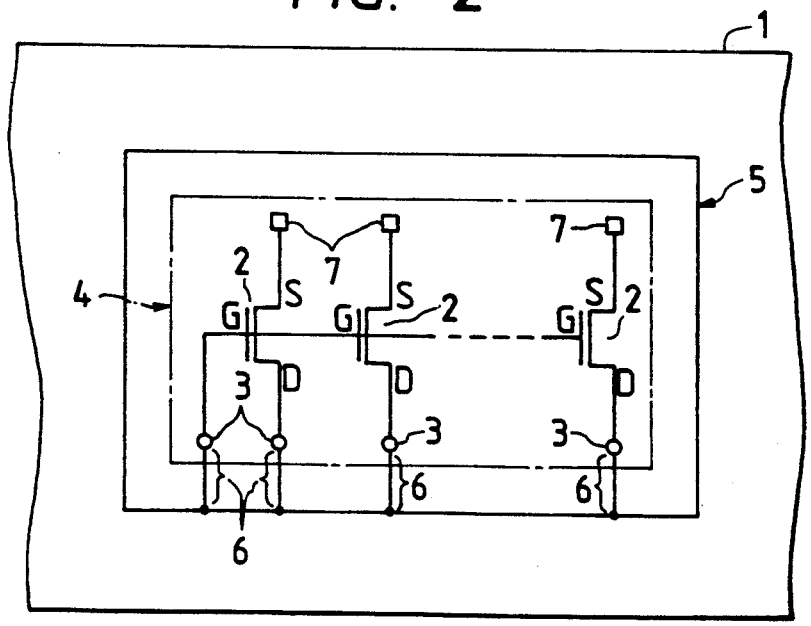
FIG. 2 is a diagram illustrating a second embodiment of the present invention.

In FIG. 2, a pad 7 is connected with only an output electrode of an in associated thin film transistor and is not connected with the other ones. In this pad 7, the potential appearing in the pad 7 is used as a control signal.

The pad 7 is not connected with the guard conductor 5. On the other hand, the pad 3 connected with another electrode is connected with another circuit element through a bonding wire, so that a part of a connection line 6 remains as shown in FIG. 3 but has no effect onto the operation thereof. Therefore, in the same manner as in the case of FIG. 1, all the pads 3 are short-circuited with each other by the guard conductor 5 through the connection lines 6.

If such a treatment is given in the first step of the process of production, the gate and drain of each transistor are short-circuited through the guard conductor 5 so as to be kept equal in potential to each other, so that an insulating layer put between the gate and the drain is not subjected to discharge-breakdown even if static electricity is produce.

Since the gate and output electrode (source) are not short-circuited, if static electricity is produced, a potential difference may appear therebetween. However, since the guard conductor 5 is provided to envelop the surroundings of the thin film transistors 2, the static electricity is prevented from accumulating inside of the guard conductor 5, so that the potential difference cannot be large enough to generate discharge-breakdown in the insulation between the gate and the output electrode.

As has been described above, even in the case of producing a thin film transistor having a pad 7 which cannot be connected with a connection line 6, it is possible be prevent the insulation between electrodes from being discharge-broken.

What is claimed is:

1. A method of producing on a substrate at least one thin film transistor having electrodes with low inter-electrode capacitance, the method comprising the steps of:

forming on said substrate at least one thin film transistor having a gate, drain and source;

forming a guard conductor on said substrate;

forming electrical connections to electrically connect said gate, drain and source to said guard conductor while said gate, drain and source have substantially equal electrical potential to provide electrostatic discharge protection during the formation of said at least one thin film transistor; and severing said electrical connections to separate said guard conductor from said gate, drain and source after completion of the formation of said at least one thin film transistor.

2. A method of producing on a substrate at least one thin film transistor having electrodes with low inter-electrode capacitance, the method comprising the steps of:

forming on said substrate at least one thin film transistor having a gate, drain and source;

forming a guard conductor on said substrate;

forming electrical connections to electrically connect said gate and drain to said guard conductor while said gate and drain have substantially equal electrical potential to provide electrostatic discharge protection during the formation of said at least one thin film transistor; and severing said electrical connections to separate said guard conductor from said gate and drain after completion of the formation of said at least one thin film transistor.

3. The method according to claim 1 or 2, wherein the step of forming said guard conductor includes the step of forming said guard conductor to surround said thin film transistor.

4. The method according to claim 1 or 2, wherein the step of forming said at least one thin film transistor includes the step of forming a plurality of thin film transistors, each having a gate, drain and source.

5. The method according to claim 4, wherein the step of forming said guard conductor includes the step of forming said guard conductor to surround said plurality of thin film transistors.

* * * * *